United States Patent
Test et al.

(10) Patent No.: US 6,800,555 B2
(45) Date of Patent: Oct. 5, 2004

(54) WIRE BONDING PROCESS FOR COPPER-METALLIZED INTEGRATED CIRCUITS

(75) Inventors: Howard R. Test, Plano, TX (US); Gonzalo Amador, Dallas, TX (US); Willmar E. Subido, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/817,696

(22) Filed: Mar. 23, 2001

(65) Prior Publication Data

US 2001/0035452 A1 Nov. 1, 2001

Related U.S. Application Data

(60) Provisional application No. 60/192,108, filed on Mar. 24, 2000.

(51) Int. Cl.[7] ............................................. H01L 21/44
(52) U.S. Cl. ...................... 438/687; 438/597; 438/614; 438/652; 438/653; 438/678
(58) Field of Search ................................. 438/517, 612, 438/613, 614, 652, 653, 654, 678, 687

(56) References Cited

U.S. PATENT DOCUMENTS

| | | |
|---|---|---|
| 4,808,769 A | 2/1989 | Nakano et al. |
| 4,857,671 A | 8/1989 | Nakano et al. |
| 4,970,571 A | 11/1990 | Yamakawa et al. |
| 4,985,076 A | 1/1991 | Iacovangelo |
| 5,212,138 A | 5/1993 | Krulik et al. |
| 5,291,374 A | 3/1994 | Hirata et al. |

(List continued on next page.)

FOREIGN PATENT DOCUMENTS

| | | |
|---|---|---|
| EP | 0 567 937 A2 | 11/1993 |
| EP | 0 949 672 A2 | 10/1999 |
| GB | 2 184 288 A | 6/1987 |
| JP | 411140658 A | 5/1999 |

OTHER PUBLICATIONS

Publication data for Ulrich et al. 1999 International Conference on High Density Packaging and MCM's reference.*

"A Low–Cost Electroless Plating Method for Producing Flip–Chip Bondable and Wire–Bondable Circuit Pads for Smart Pixel Application", Madhumita Datta, et al., IEEE, Laboratory of Physical Sciences, and Dept. of Electrical Engineering, 1998, pp. 99–100.

"Autocatalytic Gold Plating Process for Electronic Packaging Applications", John G. Gaudlello, IEEE, Electronic Components and Technology Conference, 1995, pp. 534–537.

(List continued on next page.)

*Primary Examiner*—Tom Thomas
*Assistant Examiner*—N. Drew Richards
(74) *Attorney, Agent, or Firm*—Wade James Brady, III; Frederick J. Telecky, Jr.

(57) ABSTRACT

A robust, reliable and low-cost metal structure and process enabling electrical wire/ribbon connections to the interconnecting copper metallization of integrated circuits. The structure comprises a layer of barrier metal that resists copper diffusion, deposited on the non-oxidized copper surface in a thickness such that the barrier layer reduces the diffusion of copper at 250° C. by more than 80% compared with the absence of the barrier metal. The structure further comprises an outermost bondable layer which reduces the diffusion of the barrier metal at 250° C. by more than 80% compared with the absence of the bondable metal. Finally, a metal wire is bonded to the outermost layer for metallurgical connection.

The barrier metal is selected from a group consisting of nickel, cobalt, chromium, molybdenum, titanium, tungsten, and alloys thereof. The outermost bondable metal layer is selected from a group consisting of gold, platinum, and silver.

9 Claims, 2 Drawing Sheets

U.S. PATENT DOCUMENTS

| | | | |
|---|---|---|---|
| 5,380,560 A | | 1/1995 | Kaja et al. |
| 5,436,412 A | | 7/1995 | Ahmad et al. |
| 5,656,858 A | | 8/1997 | Kondo et al. |
| 5,747,881 A | | 5/1998 | Hosomi et al. |
| 5,766,979 A | | 6/1998 | Budnaitis |
| 5,801,452 A | | 9/1998 | Farnworth et al. |
| 5,821,627 A | | 10/1998 | Mori et al. |
| 5,906,312 A | | 5/1999 | Zakel et al. |
| 5,910,644 A | | 6/1999 | Goodman et al. |
| 5,922,517 A | * | 7/1999 | Bhatt et al. ................ 430/315 |
| 5,937,320 A | | 8/1999 | Andricacos et al. |
| 6,008,543 A | | 12/1999 | Iwabuchi |
| 6,040,239 A | | 3/2000 | Akram et al. |
| 6,049,130 A | | 4/2000 | Hosomi et al. |
| 6,077,723 A | | 6/2000 | Farnworth et al. |
| 6,091,252 A | | 7/2000 | Akram et al. |
| 6,094,058 A | | 7/2000 | Hembree et al. |
| 6,097,087 A | | 8/2000 | Farnworth et al. |
| 6,107,180 A | * | 8/2000 | Munroe et al. ............... 29/840 |
| 6,306,751 B1 | | 10/2001 | Patel et al. |
| 6,320,263 B1 | * | 11/2001 | Lopatin et al. ............. 257/751 |
| 6,362,089 B1 | * | 3/2002 | Molla et al. ............... 106/1.23 |
| 6,445,069 B1 | | 9/2002 | Ling et al. |
| 2001/0033020 A1 | * | 10/2001 | Stierman et al. ............ 257/737 |

OTHER PUBLICATIONS

"Break Through Developments in Electroless Nickel/Gold Plating on Copper Based Semiconductors", Andrew J. G. Strandjord, et al., 2000 International Symposium on Advanced Packaging Materials, 2001, pp. 107–111.

"Contact and Connection Properties of Autocatalytically 16.1 Increased Gold–Deposits", R. Freuenberger, et al., Proceedings of the Forty–Second IEEE Holm Conference on Electrical Contacts, 1996, Joint with the 18$^{th}$ International Conference on Electrical Contacts, 1996, pp. 461–466.

"Crystallization of Electroless Ni–P Under Bump Metallization Induced by Solder Reaction", J. W. Jang, et al., 1999 International Symposium on Advanced Packaging Materials, pp. 252–255.

"Direct Electroless Nickel Plating on Copper Circuits Using DMAB as a Second Reducing Agent", Hideto Watanabe, et al., 1998 IEMT/IMC Proceedings, pp. 149–153.

"Electrolessly Deposited Diffusion Barriers for Microelectronics", E. J. O'Sullivan, et al., IBM J. Res. Develop., vol. 42, No. 5, Sep. 1998, pp. 607–620.

"Electroless Metal Deposition for Back–End Wafer Processes", A. Ostmann, et al., Advancing Microelectronics, May/Jun. 1999, pp. 23–26.

"Electroless Palladium Finish For Bonding Fine–Pitch Devices", George M. Milad, et al., Proceedings of the Technical Program, NEPCON West '96 Conference, Feb. 1996, pp. 1333–1341.

"Flip Chip Technologies", HBS Mark II Automatic Electroless Nickel/Immersion Gold Plate Tool, Technical Proposal #990505–2.OSH, May 1999, pp. 3–11.

"Low Cost Flip Chip Bumping Technologies", CL Wong, et al., IEEE/CPMT Electronic Packaging Technology Conference, 1997, pp. 244–250.

"Metallization for Direct Solder Interconnection of Power Devices", Shatil Haque, et al., 2000 Electronic Components and Technology Conference, pp. 1475–1482.

"Performance of Evaporated and Plated Bumps", Addi Mistry, et al., 1998 IEEE/CPMT International Electronics Manufacturing Technology Symposium, pp. 1–7.

"Solder Flip Chips Employing Electroless Nickel: An Evaluation of Reliability and Cost", Frank Stepniak, InterPACK '97 Final Draft, pp. 1–6.

"Thermosonic Gold Ball Bonding to Alternate Plating Finishes on Laminate MCM Substrates", Chris Dunn, et al., 1997 International Conference on Multichip Modules, 1997, pp. 170–176.

"Thermosonic Gold Wire Bonding to Palladium Finishes on Laminate Substrates", R. Wayne Johnson, et al., 1998 International Conference on Multichip Modules and High Density Packaging, pp. 291–299.

"Thermosonic Gold Wirebonding to Electrolessly–Metallized Copper Bondpads Over Benzocyclobutene", Richard Ulrich, et al., 1999 International Conference on High Density Packaging and MCMs, pp. 260–265.

* cited by examiner

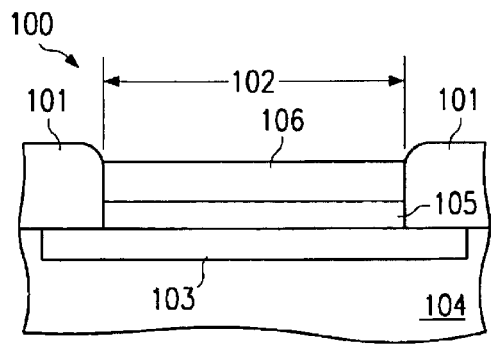
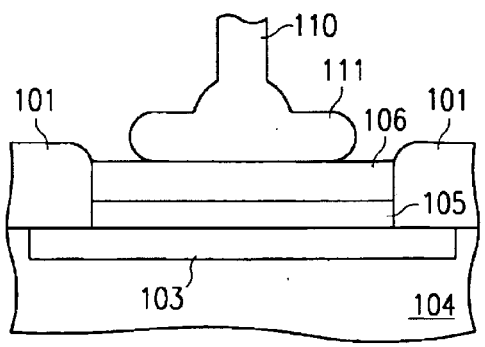
FIG. 1A          FIG. 1B
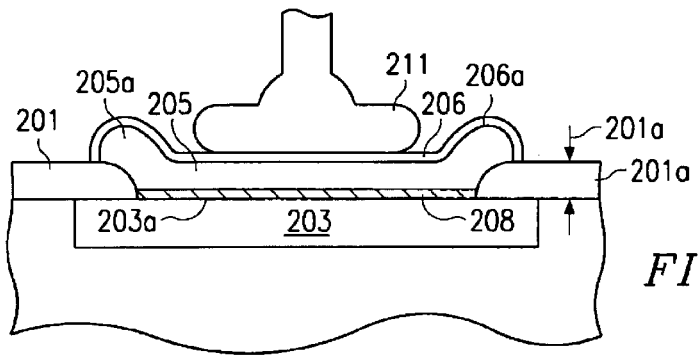
FIG. 2
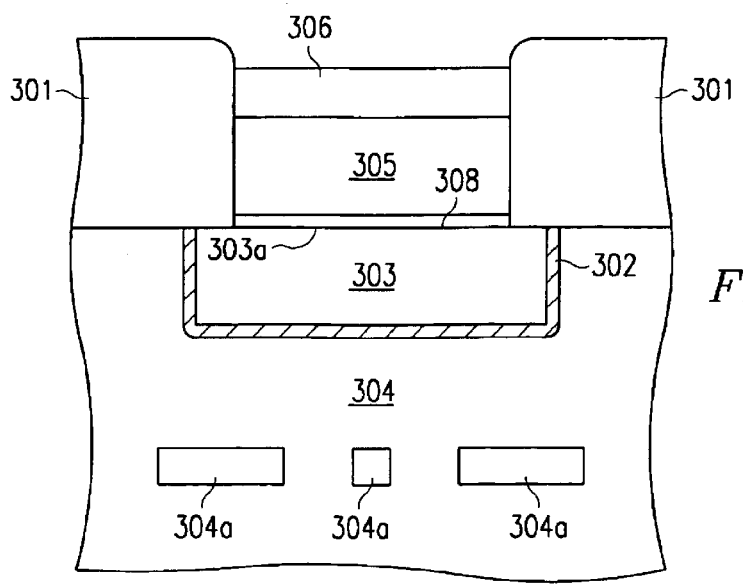
FIG. 3

WIRE BONDING PROCESS FOR COPPER-METALLIZED INTEGRATED CIRCUITS

CROSS REFERENCE TO PRIOR APPLICATIONS

This application claims priority from provisional application Serial No. 60/192,108, filed Mar. 24, 2000 under 35 U.S.C. 119(e).

BACKGROUND OF THE INVENTION

The present invention is related in general to the field of semiconductor devices and processes and more specifically to the process of wire bonding to bond pads of copper-metallized integrated circuits.

DESCRIPTION OF THE RELATED ART

In integrated circuits (IC) technology, pure or doped aluminum has been the metallization of choice for interconnection and bond pads for more than four decades. Main advantages of aluminum include easy of deposition and patterning. Further, the technology of bonding wires made of gold, copper, or aluminum to the aluminum bond pads has been developed to a high level of automation, miniaturization, and reliability. Examples of the high technical standard of wire bonding to aluminum can be found in U.S. Pat. No. 5,455,195, issued on Oct. 3, 1995 (Ramsey et al., "Method for Obtaining Metallurgical Stability in Integrated Circuit Conductive Bonds"); U.S. Pat. No. 5,244,140, issued on Sep. 14, 1993 (Ramsey et al., "Ultrasonic Bonding Process Beyond 125 kHz"); U.S. Pat. No. 5,201,454, issued on Apr. 13, 1993 (Alfaro et al., "Process for Enhanced Intermetallic Growth in IC Interconnections"); and U.S. Pat. No. 5,023,697, issued on Jun. 11, 1991 (Tsumura, "Semiconductor Device with Copper Wire Ball Bonding").

In the continuing trend to miniaturize the ICs, the RC time constant of the interconnection between active circuit elements increasingly dominates the achievable IC speed-power product. Consequently, the relatively high resistivity of the interconnecting aluminum now appears inferior to the lower resistivity of metals such as copper. Further, the pronounced sensitivity of aluminum to electromigration is becoming a serious obstacle. Consequently, there is now a strong drive in the semiconductor industry to employ copper as the preferred interconnecting metal, based on its higher electrical conductivity and lower electromigration sensitivity. From the standpoint of the mature aluminum interconnection technology, however, this shift to copper is a significant technological challenge.

Copper has to be shielded from diffusing into the silicon base material of the ICs in order to protect the circuits from the carrier lifetime killing characteristic of copper atoms positioned in the silicon lattice. For bond pads made of copper, the formation of thin copper(I)oxide films during the manufacturing process flow has to be prevented, since these films severely inhibit reliable attachment of bonding wires, especially for conventional gold-wire ball bonding. In contrast to aluminum oxide films overlying metallic aluminum, copper oxide films overlying metallic copper cannot easily be broken by a combination of thermocompression and ultrasonic energy applied in the bonding process. As further difficulty, bare copper bond pads are susceptible to corrosion.

In order to overcome these problems, a process has been disclosed to cap the clean copper bond pad with a layer of aluminum and thus re-construct the traditional situation of an aluminum pad to be bonded by conventional gold-wire ball bonding. A suitable bonding process is described in U.S. Pat. No. 5,785,236, issued on Jul. 28, 1998 (Cheung et al., "Advanced Copper Interconnect System that is Compatible with Existing IC Wire Bonding Technology"). The described approach, however, has several shortcomings.

First, the fabrication cost of the aluminum cap is higher than desired, since the process requires additional steps for depositing metal, patterning, etching, and cleaning. Second, the cap must be thick enough to prevent copper from diffusing through the cap metal and possibly poisoning the IC transistors. Third, the aluminum used for the cap is soft and thus gets severely damaged by the markings of the multiprobe contacts in electrical testing. This damage, in turn, becomes so dominant in the ever decreasing size of the bond pads that the subsequent ball bond attachment is no longer reliable.

A low-cost structure and method for capping the copper bond pads of copper-metallized ICs has been disclosed on U.S. patent application Ser. No. 60/183,405, filed on 18 Feb. 2000. The present invention is related to that application. An urgent need has arisen for a reliable method of bonding wires to capped bond pads which combines minimum fabrication cost with maximum up-diffusion control of metals potentially capable of impeding subsequent wire bonding. The bonding method should be flexible enough to be applied for different IC product families and a wide spectrum of design and process variations. Preferably, these innovations should be accomplished while shortening production cycle time and increasing throughput, and without the need of expensive additional manufacturing equipment.

SUMMARY OF THE INVENTION

The present invention discloses a robust, reliable and low-cost metal structure and process enabling electrical wire connections to the interconnecting copper metallization of integrated circuits (IC). The structure comprises a layer of barrier metal that resists copper diffusion, deposited on the non-oxidized copper surface in a thickness such that the barrier layer reduces the diffusion of copper at 250° C. by more than 80% compared with the absence of the barrier metal. The structure further comprises an outermost layer reduces the diffusion of the barrier metal at 250° C. by more than 80% compared with the absence of the bondable metal. Finally, a metal wire is bonded to the outermost layer for metallurgical connection.

The barrier metal is selected from a group consisting of nickel, cobalt, chromium, molybdenum, titanium, tungsten, and alloys thereof. The outermost metal layer is selected from a group consisting of gold, platinum, and silver.

The present invention is related to high density and high speed ICs with copper interconnecting metallization, especially those having high numbers of metallized inputs/outputs, or "bond pads". These circuits can be found in many device families such as processors, digital and analog devices, logic devices, high frequency and high power devices, and in both large and small area chip categories.

It is an aspect of the present invention to be applicable to bond pad area reduction and thus supports the shrinking of IC chips. Consequently, the invention helps to alleviate the space constraint of continually shrinking applications such as cellular communication, pagers, hard disk drives, laptop computers and medical instrumentation.

Another aspect of the invention is to fabricate the bond pad metal caps by the self-defining process of electroless deposition, thus avoiding costly photolithographic and alignment techniques.

Another aspect of the invention is to be guided by the metal diffusion coefficients for selecting the appropriate pair of metals and the coordinated layer thicknesses in order to minimize up-diffusion at the elevated bonding temperatures and subsequent bond-inhibiting chemical reactions.

Another aspect of the invention is to advance the process and reliability of wafer-level multi-probing by eliminating probe marks and subsequent bonding difficulties.

Another object of the invention is to provide design and process concepts which are flexible so that they can be applied to many families of semiconductor products, and are general so that they can be applied to several generations of products.

Another object of the invention is to use only designs and processes most commonly employed and accepted in the fabrication of IC devices, thus avoiding the cost of new capital investment and using the installed fabrication equipment base.

These objects have been achieved by the teachings of the invention concerning selection criteria and process flows suitable for mass production. The non-oxidized surface of the copper of the bond pad is seeded by a metal such as palladium and covered with a layer of a barrier metal such as nickel. The thickness of this barrier layer has to be such that it prevents excessive copper up-diffusion at the elevated temperatures of the bonding operation. The outermost layer is a bondable metal such as palladium or gold. The layer thickness has to be such that it prevents nickel up-diffusion to the surface, where it would oxidize and impede wire bonding. In mass production, the various metal layers are deposited by electroless plating, thus avoiding the need for expensive photolithographic definition steps.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 1A and 1B illustrate schematic cross sections of the preferred embodiment of the invention.

FIG. 1A shows a bondable cap of stacked layers over a bond pad of an integrated circuit having copper metallization.

FIG. 1B shows the bond pad of FIG. 1A including a ball-bonded wire.

FIG. 2 is a more detailed yet still schematic cross section of the preferred embodiment of the invention.

FIG. 3 is a more detailed yet still schematic cross section of the preferred embodiment of the invention.

Figure 4:
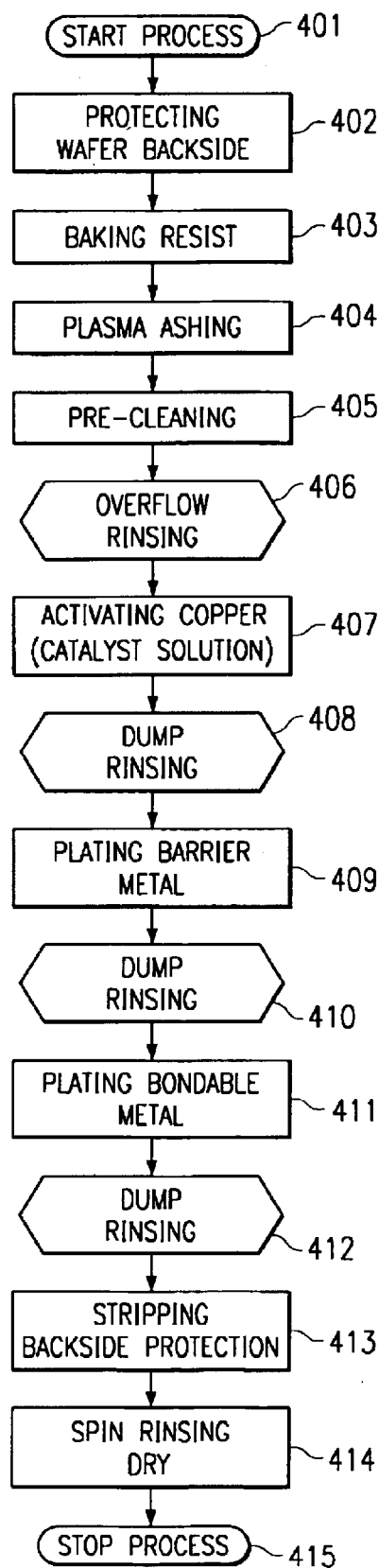
FIG. 4 illustrates a block diagram of the process flow for fabricating the bond pad cap according to the invention.

APPENDIX: The Table is listing the calculated thicknesses of barrier metal layers which are required to reduce the up-diffusion of the underlying metal by more than 80% compared with the absence of the barrier metal.

DETAILED DESCRIPTION OF THE PREFERRED EMBODIMENTS

FIG. 1A shows a schematic cross section of the preferred embodiment of the invention, generally designated 100. An integrated circuit (IC) has copper interconnecting metallization and is covered by a moisture-impenetrable protective overcoat 101. This overcoat is-usually made of silicon nitride, commonly 0.5 to 1.0 $\mu$m thick. A window 102 is opened in the overcoat in order to expose portion of the copper metallization 103. Not shown in FIG. 1A is the underlayer embedding the copper and preventing its diffusion into parts of the IC (usually made of tantalum nitride, tantalum silicon nitride, tungsten nitride, tungsten silicon nitride, titanium, titanium nitride, or titanium tungsten; see FIG. 3).

In FIG. 1A, the dielectric IC portions 104 are only summarily indicated. These electrically insulating portions may include not only the traditional plasma-enhanced chemical vapor deposited dielectrics such as silicon dioxide, but also newer dielectric materials having lower dielectric constants, such as silicon-containing hydrogen silsesquioxane, organic polyimides, aerogels, and parylenes, or stacks of dielectric layers including plasma-generated or ozone tetraethylorthosilicate oxide. Since these materials are less dense and mechanically weaker than the previous standard insulators, the dielectric under the copper is often reinforced. Examples can be found in U.S. patent applications Ser. No. 60/085,876, filed on May 18, 1998 (Saran et al., "Fine Pitch System and Method for Reinforcing Bond Pads in Semiconductors"), and U.S. Pat. No. 60/092,961, filed Jul. 14, 1998 (Saran, "System and Method for Bonding over Active Integrated Circuits").

Since copper is susceptible to corrosion and even thin copper(I)oxide films are difficult to bond to, the present invention provides structures and processes of a cap formed over the exposed copper, as described in FIGS. 1, 2 and 3. According to the invention, the cap consists of a stack of metals having coordinated thicknesses such that the stack satisfies three requirements:

The cap acts as a barrier against the up-diffusion of copper to the surface of the cap where the copper might impede the subsequent wire bonding operation. Specifically, the cap the metal selections and thicknesses are coordinated such that the cap reduces the up-diffusion of copper at 250° C. by more than 80% compared with the absence of the barrier metal.

The cap is fabricated by a technique, which avoids expensive photolithographic steps. Specifically, an electroless process is used to deposit the cap metal layers.

The cap has an outermost metal surface which is bondable. Specifically, conventional ball and wedge bonding techniques can be used to connect metal wires and other coupling members metallurgically to the bond pad.

As indicated in FIGS. 1B and 2, wire ball bonding is the preferred method of using coupling members to create electrical connections. Another method is ribbon bonding employing wedge bonders. In contrast to wedge bonding, ball bonding operates at elevated temperatures for which the materials and processes of this invention need to be harmonized.

The wire bonding process begins by positioning both the IC chip with the bond pads and the object, to which the chip is to be bonded, on a heated pedestal to raise their temperature to between 170 and 300° C. A wire 110 (in FIG. 1B), typically of gold, gold-beryllium alloy, other gold alloy, copper, aluminum, or alloys thereof, having a diameter typically ranging from 18 to 33 $\mu$m, is strung through a heated capillary where the temperature usually ranges between 200 and 500° C. At the tip of the wire, a free air ball is created using either a flame or a spark technique. The ball has a typical diameter from about 1.2 to 1.6 wire diameters. The capillary is moved towards the chip bonding pad (102 in FIG. 1A) and the ball is pressed against the metallization of the bonding pad cap (layer 106 in FIGS. 1A and 1B). A combination of compression force and ultrasonic energy creates the formation of a strong metallurgical bond by metal interdiffusion. At time of bonding, the temperature usually ranges from 150 to 270° C. In FIG. 1B, schematic form 111 exemplifies the final shape of the attached "ball" in wire ball bonding.

It is important for the present invention that recent technical advances in wire bonding now allow the formation of small yet reliable ball contacts and tightly controlled shape of the wire loop. Ball pitches as small as between 75 and 40 µm can be achieved. Such advances can, for instance, be found in the computerized bonder 8020 by Kulicke & Soffa, Willow Grove, Pa., U.S.A., or in the ABACUS SA by Texas Instruments, Dallas, Tex., U.S.A. Moving the capillary in a predetermined and computer-controlled manner through the air will create a wire looping of exactly defined shape. Finally, the capillary reaches its desired destination and is lowered to touch the contact pad of the object. With an imprint of the capillary, a metallurgical stitch bond is formed, and the wire is flamed off to release the capillary. Stitch contacts are small yet reliable; the lateral dimension of the stitch imprint is about 1.5 to 3 times the wire diameter (its exact shape depends on the shape of the capillary used, such as capillary wall thickness and capillary footprint).

It is an advantage of the present invention to provide a metal cap surface of the bond pad hard enough that the fine-tip needles used in electrical multiprobing do not create probe marks. A soft metal surface, torn up by the needle-imprint, is particularly difficult to bond to when the area of the bond pad is so small—a trend in contemporary bond pad shrinking—that the imprint disturbs most of the available bonding area.

According to the invention, the metal cap over the copper 103 provided by two layers:

Layer 105 is positioned over copper 203, sometimes deposited metal layer (see FIGS. 2 and 3). Examples for layer 105 are nickel, cobalt, chromium, molybdenum, titanium, tungsten, and alloys thereof. These metals are inexpensive and can be deposited by electroless plating; however, they are poorly bondable. In these metals, copper has a diffusion coefficient of less than $1 \times 10E-23$ cm$^2$/s at 250° C. Consequently, these metals are good copper diffusion barriers. The layer thicknesses required to reduce copper diffusion by more than 80% compared to the absence of the layers are obtained by diffusion calculations. As an example, the Table of the Appendix lists the layer thickness of nickel when copper is diffusing at 250° C. or 160° C., with diffusion time (min) as parameter. Generally, a barrier thickness from about 0.5 to 1.5 µm will safely meet the copper reduction criterion.

Layer 106 is positioned over layer 105 as the outermost layer of the cap; it is bondable so that it can accept the wire bond 111. Examples for layer 106 are gold, platinum, palladium, and silver. In addition, these metals have a diffusion coefficient for the metals used in barrier 105 (such as nickel) of less than $1 \times 10E-14$ cm$^2$/s at 250° C. Consequently, these metals are good diffusion barriers for the materials of layer 105. Again, the layer thicknesses required to reduce the up-diffusion of metal used in layer 105 by more than 80% compared to the absence of layer 106 are obtained from diffusion calculations. As an example, the Table of the Appendix lists the layer thickness (µm) of gold when nickel is up-diffusing at 250° C. or 160° C., with diffusion time (min) as parameter. Generally an outermost layer thickness of 1.5 µm or somewhat less will safely meet the reduction criterion for metal diffusing from layer 105.

As another example, the Table of the Appendix lists the layer thickness (µm) of palladium when nickel is up-diffusing at 250° C. or 160° C., with diffusion time (min) as parameter. Generally, a thickness of outermost layer 106 of about 0.4 to 1.5 µm will safely meet the reduction criterion for metal diffusing from layer 105.

The process flow of electroless plating is described in conjunction with FIG. 4. Usually, the plated layers will fit into the size of the bond pad opening (102 in FIG. 1A). For bond pads having protective overcoats of reduced thickness, however, one or more of the plated layers may grow electrolessly beyond the periphery of the opening. FIG. 2 illustrates schematically an example for this layer growth. The protective overcoat layer 201 has reduced thickness 201a (for instance, 0.5 µm instead of the usual 1.0 µm). While the metal seed layer 208, plated directly over the non-oxydized surface 203a of the copper metallization 203, fits easily within the overcoat opening, the barrier layer 205 and the bondable layer 206 grow beyond the opening periphery. This cap region is designated 205a and 206a in FIG. 2; it does not affect the metallurgical attachment of wire "ball" 211, but could affect the minimum distance to adjacent bond pads.

FIG. 3 summarizes the preferred embodiment of the present invention in more detail; most dimension ranges are quoted in FIGS. 1a and 1B, and the electroless plating and other fabrication process steps are discussed in FIG. 4. The protective overcoat 301 has an opening, which defines the size of the bond pad, and a thickness sufficient to accommodate all of the stacked layers, which cap the bond pad IC copper metallization 303. The copper trace 303 is imbedded in refractory metal shield 302 (for example, tantalum nitride), which is surrounded by dielectric 304 and metal re-enforcements 304a; methods quoted above).

Directly facing the cleaned and non-oxidized copper surface 303a is the first layer of the cap, a thin layer 308 of seed metal (for example, palladium, about 5 to 10 nm thick; another choice is tin). Immediately following the seed metal layer is metal layer 305 (for example, nickel) as a barrier against up-diffusing copper. On top of this barrier layer is metal layer 306 (for example, gold, or palladium) as a barrier against up-diffusing barrier metal (such as nickel) and, at the same time, as the outermost layer of the cap which-is metallurgically bondable.

The electroless process used for fabricating the bond pad cap of FIG. 3 is detailed in FIG. 4. After the bond pads have been opened in the protective overcoat, exposing the copper IC metallization in bond pad areas, the cap deposition process starts at 401; the sequence of process steps is as follows:

Step 402: Coating the backside of the silicon IC wafer with resist using a spin-on technique. This coat will prevent accidental metal deposition on the wafer backside.

Step 403: Baking the resist, typically at 110° C. for a time period of about 30 to 60 minutes.

Step 404: Cleaning of the exposed bond pad copper surface using a plasma ashing process for about 2 minutes.

Step 405: Cleaning by immersing the wafer, having the exposed copper of the bond pads, in a solution of sulfuric acid, nitric acids, or ant other acid, for about 50 to 60 seconds.

Step 406: Rinsing in overflow rinser for about 100 to 180 seconds.

Step 407: Immersing the wafer in a catalytic metal chloride solution, such as palladium chloride, for about 40 to 80 seconds "activates" the copper surface, i.e., a thin layer of seed metal (such as palladium) is deposited onto the clean non-oxidized copper surface.

Step 408: Rinsing in dump rinser for about 100 to 180 seconds.

Step 409: Electroless plating of barrier metal against copper up-diffusion. If nickel is selected, plating between 150 to 180 seconds will deposit about 0.4 to 0.6 $\mu$m thick nickel.

Step 410: Rinsing in dump rinser for about 100 to 180 seconds. cap deposition process starts at 401; the sequence of process steps is as follows:

Step 402: Coating the backside of the silicon IC wafer with resist using a spin-on technique. This coat will prevent accidental metal deposition on the wafer backside.

Step 403: Baking the resist, typically at 110° C. for a time period of about 30 to 60 minutes.

Step 404: Cleaning of the exposed bond pad copper surface using a plasma ashing process for about 2 minutes.

Step 405: Cleaning by immersing the wafer, having the exposed copper of the bond pads, in a solution of sulfuric acid, nitric acids, or any other acid, for about 50 to 60 seconds.

Step 406: Rinsing in overflow rinser for about 100 to 180 seconds.

Step 407: Immersing the wafer in a catalytic metal chloride solution, such as palladium chloride, for about 40 to 80 seconds "activates" the copper surface, i.e., a thin layer of seed metal (such as palladium) is deposited onto the clean non-oxidized copper surface.

Step 408: Rinsing in dump rinser for about 100 to 180 seconds.

Step 409: Electroless plating of barrier metal against copper up-diffusion. If nickel is selected, plating between 150 to 180 seconds will deposit about 0.4 to 0.6 $\mu$m thick nickel.

Step 410: Rinsing in dump rinser for about 100 to 180 seconds.

Step 411: Electroless plating of outermost layer, which is bondable and simultaneously provides a barrier against up-diffusion of the underlying barrier metal. If gold or palladium is selected, plating between 150 to 180 seconds will deposit about 0.4 to 0.6 $\mu$m thick gold or palladium, respectively. A preferred process uses first an immersion step with self-limiting surface metal replacement. If gold is selected, plating between 400 and 450 seconds will deposit approximately 30 nm thick gold. As a second step for thicker metal layer (0.5 to 1.5 $\mu$m thick), the immersion process to is followed by an autocatalytic process step.

Step 412: Rinsing in dump rinser for about 100 to 180 seconds.

Step 413: Stripping wafer backside protection resist for about 8 to 12 minutes.

Step 414: Spin rinsing and drying for about 6 to 8 minutes. The bond pad cap fabrication process stops at 415.

The subsequent metallurgical connection of metal wires or ribbons by a ball or wedge bonding process is described above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention can be applied to IC bond pad metallizations other than copper, which are difficult or impossible to bond by conventional ball or wedge bonding techniques, such as alloys of refractory metals and noble metals. As another example, the invention can be extended to batch processing, further reducing fabrication costs. As another example, the invention can be used in hybrid technologies of wire/ribbon bonding and solder interconnections. It is therefore intended that the appended claims encompass any such modifications or embodiments.

We claim:

1. A method for forming metallurgical connections between metal wires and bond pads positioned on integrated circuits having copper interconnecting metallization, comprising the steps of:

depositing seed metal to activate the surface of said copper metallization of said bond pads;

plating on said seed metal a barrier layer, by electroless deposition, said barrier layer having a thickness of at least about 0.5 $\mu$m, said barrier layer selected from a group consisting of nickel, cobalt, chromium, molybdenum, titanium, tungsten, and alloys thereof;

plating on said barrier layer a bondable layer, by electroless deposition, said bondable layer having a thickness of at least about 0.4 $\mu$m, said bondable layer selected from a group consisting of gold, palladium, platinum, and silver; and bonding one of said metal wires onto said bondable layer;

wherein said step of plating on said barrier layer a bondable layer comprises the steps of:

conducting a self-limiting, surface metal replacement; and conducting an autocatalytic deposition.

2. The method of claim 1, wherein said step of plating on said seed metal a barrier layer comprises plating said barrier layer having a thickness in the range of about 0.5 $\mu$m to about 1.5 $\mu$m.

3. The method of claim 1, wherein said step of plating on said barrier layer a bondable layer comprises plating said bondable layer having a thickness in the range of about 0.4 $\mu$m to about 1.5 $\mu$m.

4. The method of claim 1, wherein said step of depositing seed metal is preceded by a step comprising:

depositing a protective overcoat over the surface of said integrated circuit, including the surface portions having copper metallization; and opening selected areas of said overcoat, exposing the surface of said copper metallization.

5. The method of claim 4, further comprising the step of immersing said exposed surface of said copper metallization in an acid solution.

6. A method for forming metallurgical connections between metal wires and bond pads positioned on integrated circuits having copper interconnecting metallization, comprising:

depositing palladium seed metal to activate the surface of said copper metallization of said bond pads;

plating on said seed metal a layer of nickel by electroless deposition, said layer of nickel having a thickness of at least about 0.5 $\mu$m;

plating on said layer of nickel a layer of gold, by electroless deposition, said layer of gold having a thickness of at least about 0.4 μm; and bonding one of said metal wires onto said layer of gold;

wherein said step of plating on said nickel layer a layer of gold comprises the steps of:

conducting a self-limiting surface metal replacement; and conducting an autocatalytic deposition.

7. The method of claim 6, wherein said step of plating on said seed metal a layer of nickel comprises plating a nickel layer having a thickness in the range of about 0.5 μm to about 1.5 μm.

8. The method of claim 6, wherein said step of plating on said layer of nickel a layer of gold comprises plating a gold layer having a thickness in the range of about 0.4 μm to about 1.5 μm.

9. The method of claim 6, wherein said step of depositing seed metal is preceded by a step comprising:

depositing a protective overcoat over the surface of said integrated circuit, including the surface portions having copper metallization; and opening selected areas of said overcoat, exposing the surface of said copper metallization.

* * * * *